(12) United States Patent
Ponomarev (10) Patent No.: US 7,535,015 B2
(45) Date of Patent: May 19, 2009

(54) SEMICONDUCTOR DEVICE METHOD OF MANUFACTURING A QUANTUM WELL STRUCTURE AND A SEMICONDUCTOR DEVICE COMPRISING SUCH A QUANTUM WELL STRUCTURE

(75) Inventor: Youri Ponomarev, Leuven (BE)

(73) Assignee: NXP B.V., Eindhoven (NL)

( * ) Notice: Subject to any disclaimer, the term of this patent is extended or adjusted under 35 U.S.C. 154(b) by 261 days.

(21) Appl. No.: 10/563,483

(22) PCT Filed: Jun. 29, 2004

(86) PCT No.: PCT/IB2004/051040

§ 371 (c)(1),
(2), (4) Date: Jan. 3, 2006

(87) PCT Pub. No.: WO2005/004241

PCT Pub. Date: Jan. 13, 2005

(65) Prior Publication Data

US 2006/0157685 A1  Jul. 20, 2006

(30) Foreign Application Priority Data

Jul. 2, 2003  (EP)  ................................ 03101982

(51) Int. Cl.
  *H01L 29/06*  (2006.01)
  *H01L 31/00*  (2006.01)
(52) U.S. Cl. .......... 257/14; 257/E33.008; 257/E31.033; 257/E29.072
(58) Field of Classification Search ..... 372/43.01–50.1; 438/637, 638; 257/E21.579, 14, E33.008, 257/E31.033, E29.072
See application file for complete search history.

(56) References Cited

U.S. PATENT DOCUMENTS

| | | | |
|---|---|---|---|
| 4,665,412 A | | 5/1987 | Ohkawa |
| 4,695,857 A | | 9/1987 | Baba |
| 4,908,678 A | | 3/1990 | Yamazaki |
| 5,055,887 A | | 10/1991 | Yamazaki |
| 5,359,617 A | * | 10/1994 | Kano et al. ............. 372/45.01 |
| H001570 H | * | 8/1996 | Lux et al. ................. 257/25 |
| 5,565,693 A | * | 10/1996 | Sasaki et al. ............. 257/94 |
| 5,574,289 A | * | 11/1996 | Aoki et al. ............... 257/17 |

(Continued)

OTHER PUBLICATIONS

Koji Y et al: "The Formation of Resonance Tunnel Divice by Gamma-AL203/SI . . . ", Extended Abstracts of the International Conference on Solid State Devices and Materials; Japan Society of Applied Physics; Tokyo JA; vol. 2001; Sep. 26, 2001; pp. 588-589.

(Continued)

*Primary Examiner*—Michelle Estrada (57) ABSTRACT

Consistent with example embodiments a semiconductor device and a method are disclosed for obtaining on a substrate a multilayer structure with a quantum well structure. The quantum well structure comprises a semiconductor layer sandwiched by insulating layers, wherein the material of the insulating layers has preferably a high dielectric constant. In a field effect transistor (FET) the quantum wells function as channels, allowing a higher drive current and a lower off current. Short channel effects are reduced. The multi-channel FET is suitable to operate even for sub-35 nm gate lengths.

In the method the quantum wells are formed by epitaxial growth of the high dielectric constant material and the semiconductor material alternately on top of each other, preferably with molecular beam epitaxy (MBE).

11 Claims, 5 Drawing Sheets

U.S. PATENT DOCUMENTS 6,069,368 A * 5/2000 Wilk et al. .................... 257/25
2004/0179198 A1 * 9/2004 Serna, Jr. .................... 356/366

OTHER PUBLICATIONS

Lu Z H et al: "Crystalline Si/SiO 2 Quantum Wells"; Applied Physics Letters, American Institute of Physics; New York, US; vol. 80, No. 2; Jan. 14, 2002, pp. 255-257.

Mereu B et al: "Fowler-Nordheim Tunneling in Epitaxial Yttrium Oxide on Silicon for High-K Gate Applications"; 2002 International Semiconductor Conference; CAS 2002 Proceedings; IEEE Piscataway; NJ USA; vol. 2 Oct. 8, 2002; pp. 309-312.

J. Alieu et al: "Multiple SiGe Quantum Wells—Novel Channel Architecture for 0.2 CMOS"; Proceedings of the 29$^{th}$ European Solid-State Device Research Conference; Leuven, Belguim; Sep. 13-15, 1999; p. 292-295.

* cited by examiner

SEMICONDUCTOR DEVICE METHOD OF MANUFACTURING A QUANTUM WELL STRUCTURE AND A SEMICONDUCTOR DEVICE COMPRISING SUCH A QUANTUM WELL STRUCTURE

The invention relates to a semiconductor device comprising a substrate with a multilayer structure, the multilayer structure comprising a quantum well structure which comprises a semiconductor layer sandwiched by further layers.

The invention further relates to a method of manufacturing a quantum well structure on a substrate, comprising the steps of:
 forming a layer of electrically insulating material,
 forming a layer of semiconductor material.

The invention further relates to method of manufacturing a semiconductor device comprising such a quantum well.

The article "Multiple SiGe Quantum Wells—Novel Channel Architecture for 0.12 CMOS", J. Alieu, T. Skotnicki, J.-L. Regolini and G. Bremond, Proceedings of the 29$^{th}$ European Solid-State Device Research Conference, Leuven, Belgium, 13-15 September 1999, p. 292-295 discloses a field effect transistor. The field effect transistor is a MOSFET having a quantum well structure on a silicon substrate. The quantum well structure comprises a SiGe semiconductor layer enclosed by silicon layers. The thickness of the SiGe layer is 4 nm and the silicon layers that enclose the SiGe layer have a thickness of 4 nm.

The epitaxially grown SiGe strained layer on Si gives a valence band offset proportional to the germanium fraction, leading to a hole confinement.

Due to this valence band offset and a lower hole effective mass, the hole mobility is increased with a factor of two. In a special embodiment a multiple quantum well is disclosed comprising three quantum well structures.

A disadvantage of the known field effect transistor with multiple SiGe quantum wells is that the improvement is limited to PMOS devices. The manufacturing of multiple SiGe quantum wells is difficult due to relaxation of the strained SiGe layer and diffusion of Ge from the SiGe quantum well towards the surface.

It is an object of the invention to provide a semiconductor device of the type mentioned in the openings section, in which charge transport is improved both for p-type and n-type devices.

This object is achieved in the semiconductor device according to the invention in that the material of the further layers is an electrical insulating material.

Solids that are insulators generally have a relatively large bandgap (generally larger than a few eV), leading to non-observable conductivity below the melting point. The semiconductor layer enclosed by the insulating layers is a quantum well when the semiconductor layer has a thickness smaller than the de Broglie wavelength of a charge carrier movable in the plane of the semiconductor layer. The difference in workfunction between the material of the insulator and semiconductor material determines the potential difference V of the quantum well.

The potential difference can occur in the conduction band or in the valence band. The potential difference can be positive or negative.

When a charge carrier is confined by some potential V and the width of the well is comparable to its de Broglie wavelength, the particle's momentum hk is quantized. The continuous energy spectrum $E(k)=h^2k^2/2$ m corresponding to free motion (m is the particle mass) is broken up into energy subbands $E_n(k)$, with n an integer. As long as the confinement V(r) is not infinite, the particle has a finite probability of being in the classically forbidden bandgap region. Charge carrier transport takes place in the energy subbands of the quantum well. The relative large potential difference V allows several subbands in the quantum well. Because these energy subbands function as channels for charge carriers, the transport of charge carriers is significantly improved. The charge carriers can be electrons or holes. The semiconductor device can e.g. be a field effect transistor, a bipolar transistor, a photodiode or a laser.

It is advantageous when a further quantum well is present stacked on the at least one quantum well forming a superlattice. The distance between the quantum wells is then so short that there is overlap between the wave function of charge carriers in the quantum wells. The overlapping wave functions form energy minibands. The coupling of the charge in the quantum wells results in an enhanced carrier transport through the minibands.

Preferably the insulator is a high-k dielectric. The term high-k dielectric refers to dielectrics having a dielectric constant larger than that of $SiO_2$. The theoretically value of the dielectric constant of $SiO_2$ is 3.9. A high-k dielectric constant improves the capacitive coupling between the charge carriers in the quantum wells and enhances the overlap in wave functions of charge carriers in the quantum wells.

In an advantageous embodiment the semiconductor device is a field effect transistor with a gate, the gate being positioned substantially parallel to the at least one quantum well structure. When the device is in operation and a voltage is applied to the gate, the gate controls the charge carrier transport in the at least one quantum well structure. Charge carriers can be supplied from a source or drain region. The source and drain regions are linked to the at least one quantum well. Charge carriers can also be generated from radiation with a certain wavelength λ. Electron-holes pairs are generated in the semiconductor and can be separated by an electrical field.

It is very advantageous when there is a superlattice formed by a plurality of quantum wells below the gate. In operation a voltage is applied to the gate in order to let a current flow from the source to drain or vice versa. The effect of having a superlattice (formed with the thin semiconductor dielectric layers) result in a presence of a gate potential formation of a single conduction band (common for all semiconductor layers, caused by non-zero overlap of vertical wavefunctions), while with the gate at zero bias, only the top layer has a charge carrier population. Because of this superlattice, in the FET the on state carrier concentration is increased, while the off state leakage current is reduced. The current is roughly proportional to the number of quantum wells.

Moreover the extension of the depletion layer of the source and drain junction does not significantly penetrate into the quantum wells. Short channel effects are therefore reduced. This is a very important advantage for CMOS transistors with sub 100 nm gatelength in which short channel effects dominate the transistor performance.

In order to obtain a good capacitive coupling from the gate to the quantum wells, the distance between the one quantum well and the further quantum well is such that the one quantum well functions as a gate for the further quantum well.

Preferably, the insulating layer comprising a high-k material therefore has an equivalent silicon oxide thickness of less than 1 nm.

In an advanced embodiment the semiconductor layer comprises silicon. Silicon can be grown epitaxially on several high-k materials when the lattice constant of the high-k material is an integer times the lattice constant of silicon or vice versa.

Confinement of charge carriers in silicon occurs when the thickness of the silicon layer is typically less than 10 nm. The charge carrier density in the inversion channel just below the gate strongly decreases when the silicon thickness is less than 5 nm. The charge carrier density in the inversion channel then becomes very dependent on the doping concentration of the semiconductor layer. The larger the doping concentration, the smaller the charge carrier density in the inversion channel.

So preferably the thickness of the silicon semiconductor layer is about 5 nm. Especially when the on-state current of the FET is made as large as possible, a few monolayers of silicon is sufficient to act as a quantum well. The insulating layer of high-k material preferably is also a few monolayers, so that the voltage of the gate can be coupled as much as possible to the charge carriers in the largest possible number of quantum wells.

Other silicon compounds like SiGe or SiGeC can be grown epitaxially on high-k materials, although there is strain in the layers. As long as the strained layer is relatively thin, relaxation does not take place. The high-k material can be epitaxially grown with molecular beam epitaxy (MBE), chemical vapor deposition (CVD), atomic layer chemical vapor deposition (ALCVD) or molecular organic chemical vapor deposition (MOCVD).

A further object of the invention is to provide a method of manufacturing a quantum well structure of the type mentioned in the opening section, in which the depth of the potential can be tuned.

The object of the method is achieved in the quantum well structure according to the invention in that the layer of insulating material and the layer of semiconductor material are grown epitaxially on top of each other.

The insulating later is crystalline and has an integer times the lattice constant of the semiconductor material or vice versa. A certain deviation of the lattice constants results in stress, which can either be compressive or tensile. As long as the layers are thin, a certain lattice mismatch still results in epitaxial growth. On the crystalline substrate usually a buffer layer is present of a semiconductor material.

The buffer layer makes the actual quantum well structure less sensitive to surface contamination. The insulating material can e.g. be a semiconductor oxide, a silicate, or a metal oxide, as long as the insulating material is crystalline. The depth of the quantum well can be either positive or negative. The large variety of insulator materials and semiconductor materials that can be grown epitaxially on top of each other offers a large freedom in designing the potential well. From the band diagrams, the conduction and valence band of the materials can be calculated in the different crystal directions. The lattice constant of many semiconductor materials can be changed a certain amount when compounds are formed, like SiGe and SiC.

The semiconductor material can be Si, Ge, GaAs, InP or any crystalline material. Preferably the substrate has a high resistivity and low loss at frequencies in the GHz range.

A multiple quantum well can be formed when the epitaxial growth of the layer of insulating material and the layer of semiconductor material is repeated several times.

The material of the insulating layer can be a high-k dielectric having a dielectric constant larger than 3.9. The larger the dielectric constant of the high-k material the easier the thickness of the layer of high-k material can be controlled in a reliable way. High-k materials such as silicates with a lattice constant close to that of Si are suitable materials to grow Si on top. The equivalent oxide thickness of the layer of insulating material is typically less than 1 nm.

Preferably the insulating layer is formed with molecular beam epitaxy. The inlet of gases is pure and the ultra high vacuum is very suitable for growing very thin epitaxial layers without contamination.

In order to circumvent the growth of an interfacial oxide the insulating layer is in-situ annealed. After epitaxial growth of the quantum well structure, the layers are annealed in the ultra high vacuum system. The temperature range is in between 200 and the 700 degrees C. In the anneal step especially the interface between the insulator and the semiconductor is improved. Dislocations can move to the surface and disappear. The in-situ anneal prevents the formation of an intermediate amorphous layer like silicon oxide or a metal silicide.

A high-k material comprising yttrium is very suitable for epitaxial growth on silicon. On a Si (001) substrate crystalline $Y_2O_3$ can be grown epitaxially. In the ideal case the YO layer consists of one domain structure, but a superstructure in YO is also very well suitable.

A very sharp silicon oxide interface is obtained, with a very thin interfacial region of 2-3 Angstrom.

In view of the large experience of the semiconductor industry with Si technology and the compatiblity with existing CMOS, BiCMOS and other embedded CMOS processes, the semiconductor layer preferably comprises silicon or a silicon-germanium compound.

A further object of the invention is to provide a method of manufacturing a semiconductor device structure of the type mentioned in the opening section, in which device the depth of the source and drain regions is not necessarily ultra-shallow compared to other sub-100 nm gate-length CMOS transistors.

The object is achieved in that the method comprises further the steps of:
  forming a gate dielectric on the quantum well structure
  forming a gate,
  forming a source region and a drain region by bringing doping atoms into the quantum well structure self aligned to the gate to a depth of at least the total thickness of the quantum well structures.

The source and drain regions can be formed self-aligned to the gate by implantation through the gate, or by diffusion from elevated source and drain regions grown epitaxially next to the gate. The gate and the epitaxially grown regions are electrically isolated from each other by spacers. The spacers can be L-shaped and can act as offset spacers for implantation of extensions of the source and drain regions. These source and drain extensions usually are located to a small extent below the gate, for obtaining a good gate control over the channel in the on state of the MOS transistor. Because the depletion layer of the source and drain junction does not significantly penetrate into the quantum wells, short channel effects are therefore reduced. This is a very important advantage for CMOS transistors with sub 100 nm gatelength in which short channel effects dominate the transistor performance.

Because the source and drain junction have parasitic capacitances, it can be further important to reduce the source and drain junction as much as possible. For a good injection of charge carriers into the quantum wells, the depth of the junctions should be at least the total thickness of the quantum wells (superlattice).

These and other features and advantages of the present invention will become apparent from the following detailed description, taken in conjunction with the accompanying drawings, which illustrate, by way of example, the principles of the invention. This description is given for the sake of example only, without limiting the scope of the invention. The reference Figures quoted below refer to the attached drawings.

Figure 1:
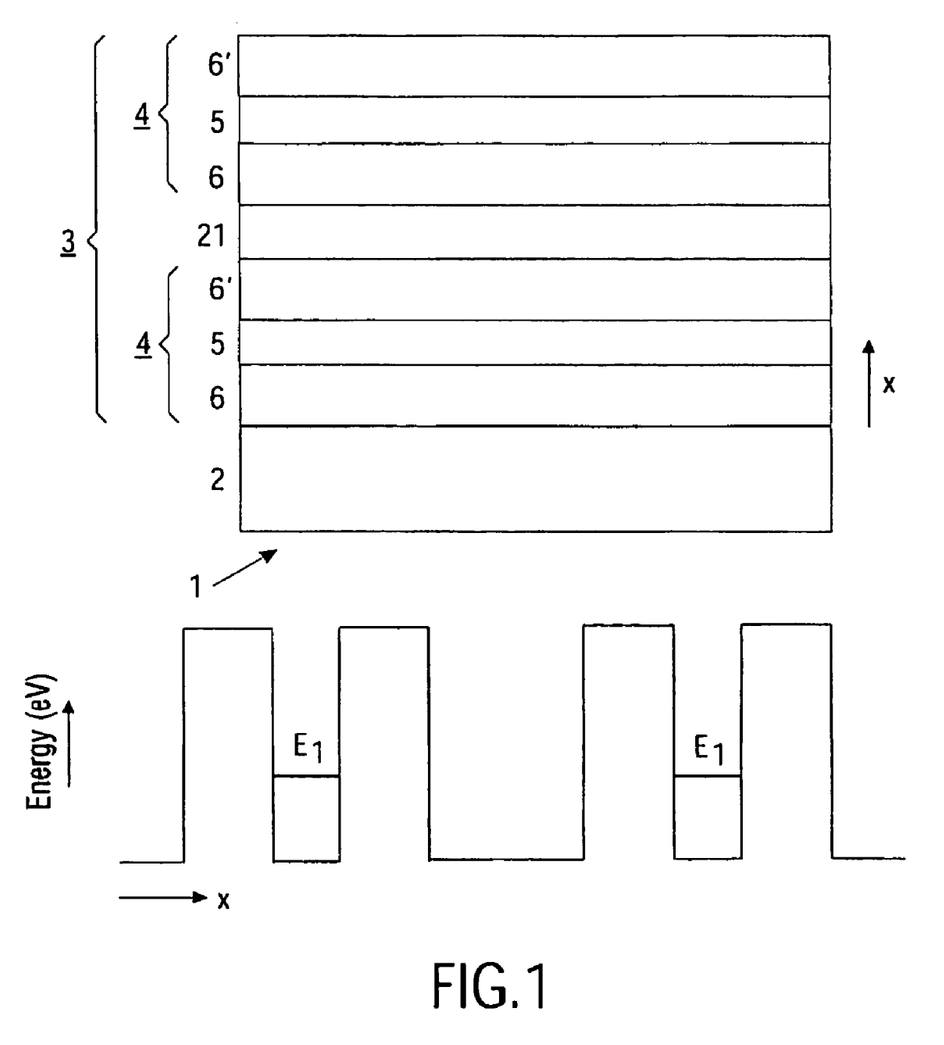
FIG. 1 is a schematic view of the semiconductor device having two quantum well structures according to the present invention.

In the embodiment of the semiconductor device 1 in FIG. 1 the substrate 2 is a p-type silicon (100) substrate with a doping concentration of $10^{17}$ at/cm$^3$ on which a multilayer structure 3 is grown. Before growing the multilayer structure, the native oxide of the substrate is removed. On the substrate a multilayer structure is grown epitaxially comprising an undoped silicon buffer layer of 20 nm. Subsequently a quantum well structure 4 is grown epitaxially with MBE. The quantum well structure 4 comprises 3 nm of $Y_2O_3$ (number 6 in FIG. 1), 5 nm Si (number 5 in FIG. 1) and 3 nm $Y_2O_3$ (number 6' in FIG. 1). Subsequently a spacer layer 21 is grown and a second quantum well 9 is grown epitaxially on top of the spacer layer. In this specific embodiment the second quantum well is the same as the first quantum well. The second quantum well 9 may comprise different high-k materials 8 and a different semiconductor layer 7 as the first quantum well 4.

The dielectric constant of the high-k material $Y_2O_3$ is about 20. Growth was performed in an UHV chamber equipped with an electron gun suitable for MBE growth of Si and Si based compounds. The lattice constant of $Y_2O_3$ (10.6 Å) is about twice the lattice constant of Si (5.43 Å). The temperature for good epitaxial quality crystalline $Y_2O_3$ on Si (001) is around 450° C. The $Y_2O_3(110)//Si$ (100) is the dominant orientation at relatively high temperatures (T>350° C.), while the $Y_2O_3$ (111)//Si (100) is preferred at lower temperatures. The formation of domains is a direct consequence of the particular hetero-epitaxial orientation $Y_2O_3$ (110)//Si(001). At higher temperature around 610° C. a reaction at the Si interface results in the formation of an $YSi_2$ phase which degrades the overall quality of the epilayer.

The substrate material is not limited to silicon. Other suitable substrate materials can be Ge, GaAs, GaN or InP. Epitaxial heterostructures can be obtained as long as the substrate has a certain lattice constant and the high-k material has a lattice constant of about an integer times the lattice constant of the substrate material. Because the multilayer structure comprises very thin high-k material layers and very thin semiconductor layers, the layers can be stressed.

In FIG. 1b the energy diagram for the multilayer structure in FIG. 1a is shown. In the quantum well a discrete energy level $E_l$ is shown for a charge carrier that can move in a direction parallel to the quantum well (in the plane of the semiconductor layer). The workfunction of the high-k material relative to the semiconductor material determines the height of the energy barrier between the quantum wells. When a charge carrier, such as an electron has an energy $E_l$, it can move through the discrete energy subband $E_l$ which is called a channel and is located in the classically forbidden bandgap of the semiconductor material. The discrete energy levels are determined by the materials of the layers in the multilayer structure, as well as by the crystal orientation. The relative large potential difference V allows several subbands in the quantum well. Because these energy subbands function as channels for charge carriers, the transport of charge carriers is significantly improved. The charge carriers can be electrons or holes which are usually injected from a source region connected to the quantum wells. Radiation such as visible light can also generate electron-hole pairs in the semiconductor. The electron-hole pairs can be separated from each other by an electrical field.

Figure 2:
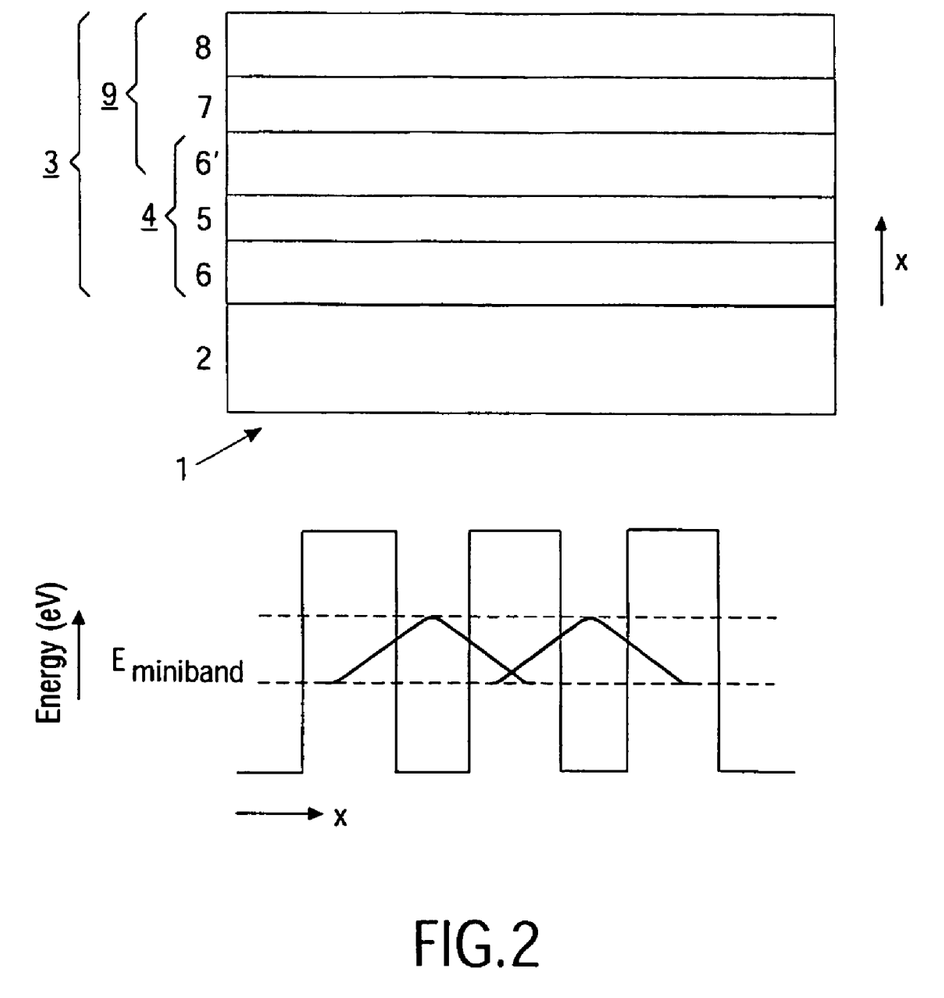
FIG. 2 is a schematic cross section of a superlattice comprising two quantum well structures according to the present invention.

In FIG. 2 a multilayer structure 3, being a superlattice is shown. The semiconductor layers 5,7 of the two quantum well structures 4,9 are each separated by an energy barrier with a potential V. The height of the energy barrier is eV.

The width of the energy barrier is determined by the thickness of the high-k layer. In this specific embodiment each $Y_2O_3$ layer has again a thickness of 3 nm, the thickness of the Si layer is 5 nm with on top 3 nm $Y_2O_3$. The overlap in wave functions of electrons in the quantum wells results in an energy miniband $E_{miniband}$. When the thickness of the high-k material is further reduced, the energy miniband can be widened and charge carrier transport is further enhanced through the energy miniband.

The higher the difference between the workfunction of the high-k material and the semiconductor material, the more energy minibands are possible. The workfunction of a semiconductor or a high-k material is dependent on the material parameters, such as crystal orientation, stress inside the material or in between the semiconductor material and the high-k material. The multilayer structure may comprise one or more layers of different dielectric constant oxides selected from the group of hafnium oxide ($HfO_2$), zirconium oxide ($ZrO_2$), strontium titanate ($SrTiO_3$), Lanthanum oxide ($La_2O_3$), Yttrium oxide ($Y_2O_3$), titanium oxide ($TiO_2$), Barium titanate ($BaTiO_3$), lanthanum aluminate ($LaAlO_3$), Lantahnum scandium oxide ($LaScO_3$) and aluminum oxide ($Al_2O_3$).

The thickness of the semiconductor layer determines the charge density distribution. The filling evolution of the discrete energy levels (due to charge carrier confinement in the Si-film) is controlled by their respective position in the Si conduction band (with respect to the Fermi level). The charge density has a maximum for a layer thickness of around 3 nm.

Figure 3:
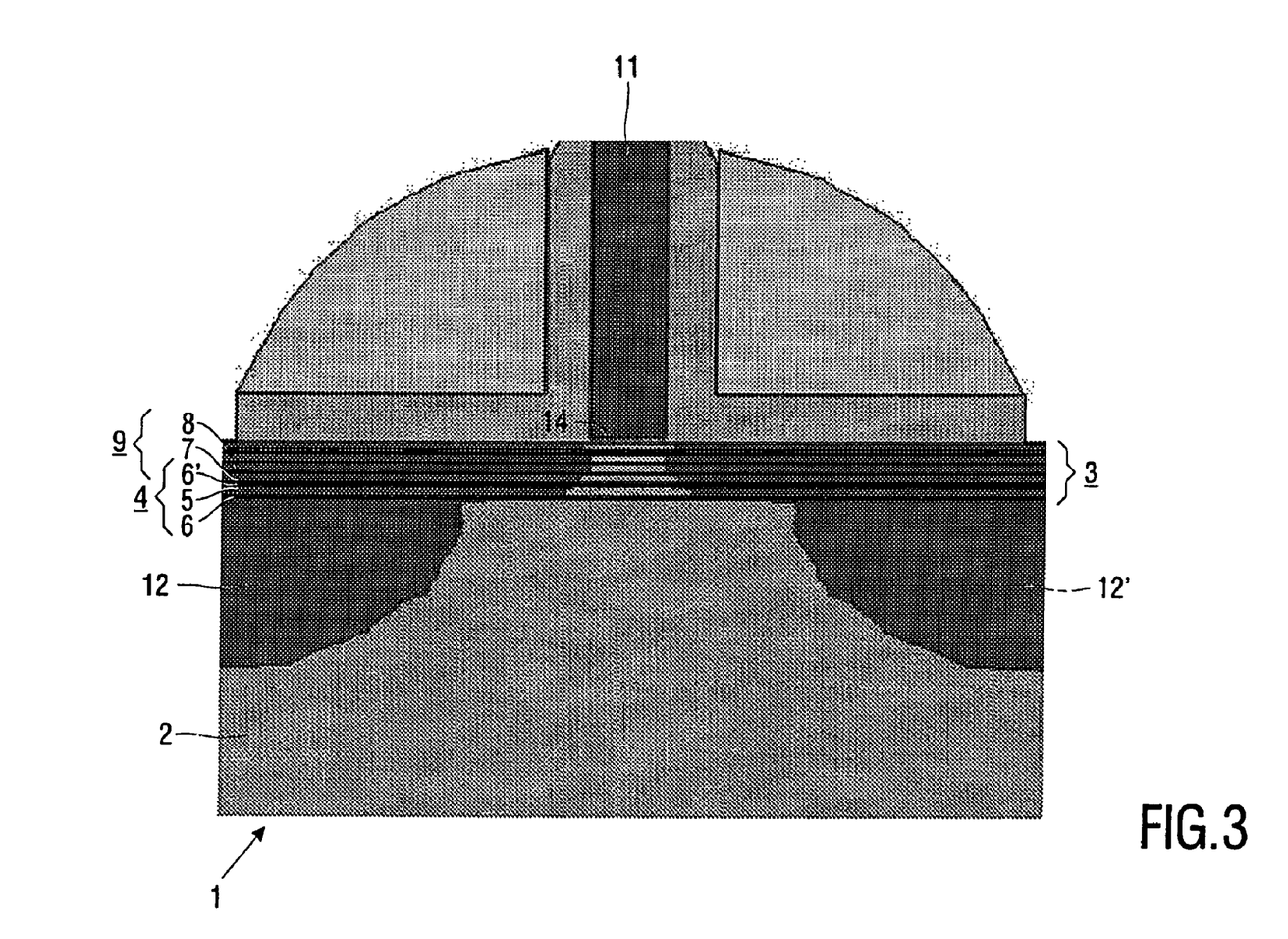
FIG. 3 is a schematic cross section of a field effect transistor having five quantum well structures according to the present invention.

In an advantageous embodiment of FIG. 3, the semiconductor device is a field effect transistor having a gate and multiple channels. In this embodiment the FET is an NMOS transistor. The p-well implantation is performed with boron at an implantation dose of $4 \times 10^{13}$ atoms/cm$^2$, at an energy of 4 keV. Instead of having bulk Si forming the channel of the transistor, which is the case in conventional FETs, first the superlattice is grown on the semiconductor substrate.

A blanket layered structure (also running in the source region 12 and the drain region 12') was deposited: an $Y_2O_3$ layer with an equivalent oxide thickness EOT of 0.6 mm was grown alternately with 3 nm Si with a doping level of As of $10^{15}$ atoms/cm$^3$ and repeated 5 times. (see FIG. 3). In this way a NMOSFET with 5 quantum wells is obtained, each of the 5 quantum wells functioning as a channel.

Then the gate dielectric is deposited. Preferably the gate dielectric is a high-k material like a Hf-based high-k dielectrics (such as a Hf—O—Si—N composition). Alternatively heavy metal oxides and their mixtures with aluminates and Si oxides (silicates) are very suitable and allow scaling down to 0.5 nm EOT, providing 2-5 orders of magnitude reduction in gate leakage.

The gate is positioned substantially perpendicular to the five quantum well structures. The capacitive coupling between the gate and the quantum well should be as strong as possible. The gate material can be a metal e.g. TaN or TiN with a workfunction midgap of Si, or highly doped polysilicon. In this specific embodiment the threshold voltage implant is performed through the gate with As at $4 \times 10^{13}$ at/cm$^2$ at 70 keV.

In order to reduce implantation damage it can be advantageous to perform the threshold voltage ($V_T$) implant into the p-well of the in the semiconductor body before growing the superlattice.

The device shown in this embodiment has a very short gate length of 25 nm. For such a short gatelength, there is no need for a threshold voltage implantation. The semiconductor layer can be intrinsic silicon.

After the gate formation dopant atoms are brought in the superlattice to form the source and drain junctions. The dopant atoms can be introduced by ion implantation or can be outdiffused from a buffer layer on top of the superlattice. For n-type transistors the dopant atoms in the source, drain and gate are As, Sb, P. In this embodiment the source 12 and drain 12' were simultaneously implanted with As at an energy of 1 keV with an offset of 15 nm. For this purpose L-shaped offset spacers were used.

For p-type transistors B or In can be used as doping atoms.

The depth of the source and drain junctions is preferably almost the same as the total layer thickness of the superlattice in the vertical direction of the FET. In the embodiment the depth is 35 nm. It is a big advantage that there is no need for ultra-shallow junctions.

If a voltage of 1 V is applied to the gate, the charge carriers are injected in the quantum wells. In this example the charge carriers are electrons. But if the polarity is opposite (PMOS device), the same is applicable to holes.

The gate potential controls the charge carrier transport in all the quantum wells. The charge carriers in the channel below the gate function as a gate for the next quantum well. In this way the channels act as one conduction channel.

Figure 4:
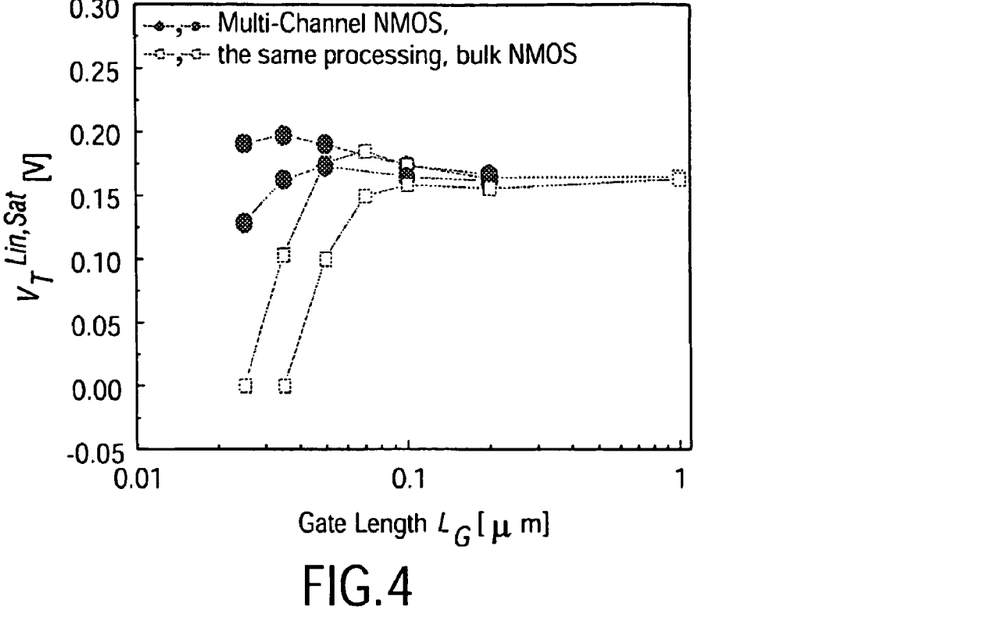
FIG. 4 shows the threshold voltage versus gate length of the field effect transistor as shown in FIG. 3 (filled circles) compared to a conventional transistor (open squares).

The depletion layer of the source and drain junction does not significantly extend into the quantum wells. Therefore the short channel effect is reduced. The reduction of short channel effects is seen in FIG. 4. The threshold voltage ($V_T$) roll-off is significantly reduced for the NMOS transistor with 5 quantum wells (filled circles) compared to a convention (and equivalent in processing) bulk NMOS transistor (open squares). If the gate is turned off, there are only charge carrier present in the channel closest to the gate. These charge carriers determine the off current.

Figure 5:
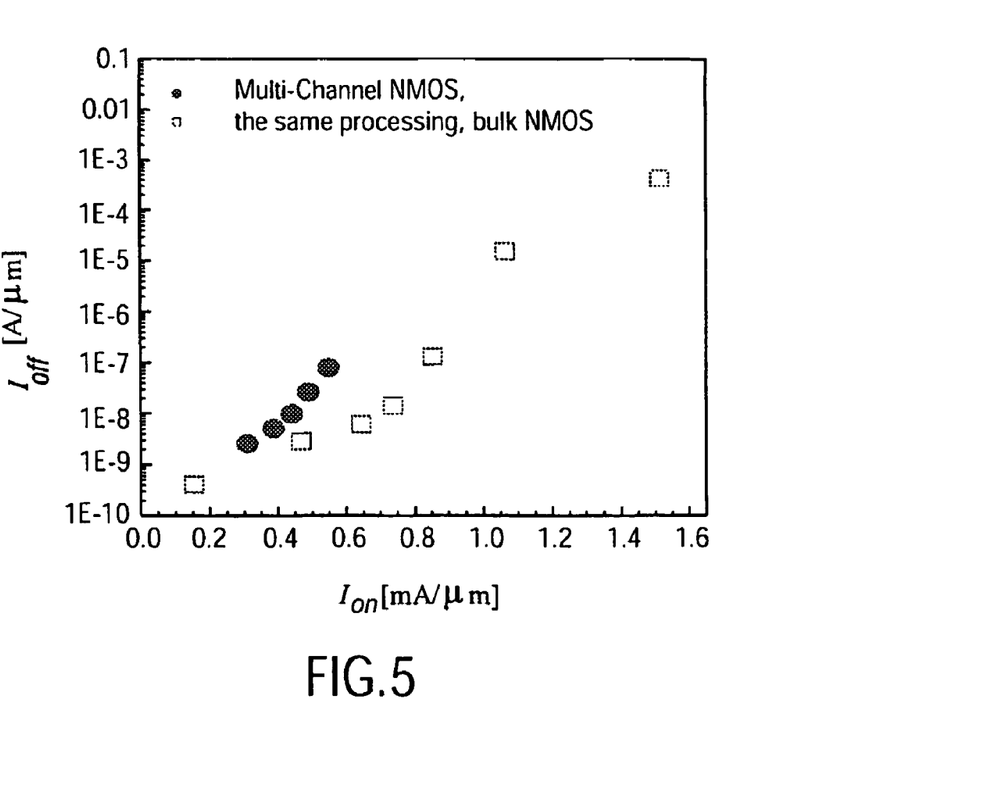
FIG. 5 shows the off-current of the field effect transistor (filled circles) of FIG. 3 compared to a conventional transistor (open squares).

In FIG. 5 is shown that the off-current is reduced with about 3 orders of magnitude for the NMOS transistor with 5 quantum wells (filled circles) compared to the conventional bulk NMOS device (open squares).

Figure 6:
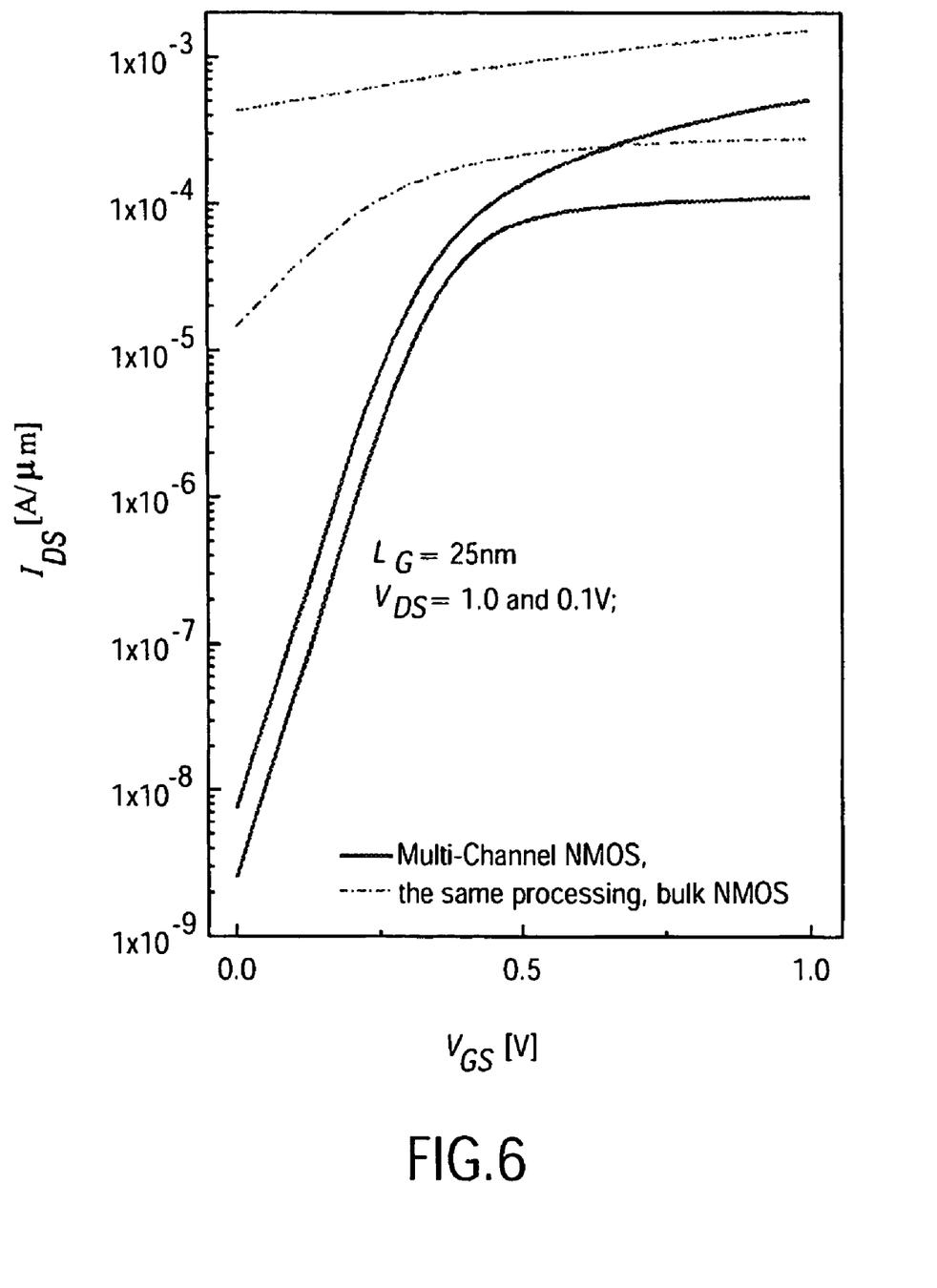
FIG. 6 shows the output characteristics (solid lines) of the field effect transistor in FIG. 3 compared with a conventional transistor (dashed lines) at two different drain-source voltages Vds=1.0 V and Vds=0.1 V.

In FIG. 6 the electrical performance of the NMOS transistor with 5 quantum wells (multi-channel MOS) is compared with a conventional (and equivalent in processing) bulk transistor. Note that the total equivalent oxide thickness is 1.5 nm for the bulk transistor, while it is 3 nm for the multi-channel MOS. The 25 nm device in the bulk case does not work at all (dashed lines), while the multi-channel MOS shows an excellent drain-source current versus gate-source voltage (Ids-Vgs) curve (solid lines). The drain to source current Ids is shown for two different drain-source voltages: Vds=1.0V and Vds=0.1 V.

The Ids, being often referred to as the on current, Ion is 520 µA/um and the off current is Ioff=7 nA/µm. The sub-threshold slope is 83 mV/dec.

One can conclude from the results that multi-channel MOS transistors has an extremely good electrical performance, especially for the sub-35 m CMOS generation. So far, it has been widely regarded as impossibility to achieve such performance with a single gate Si MOSFET. The only viable solution was believed to a be a double-gate device with an ultra-thin Si channel (1.5-5 nm).

Multiple quantum wells can be used not only in NMOS or PMOS transistors, but in any semiconductor device like bipolar transistors, HBTs, diodes, memory devices, opto-electronic or quantum devices. The invention is particular useful when confinement of charge carriers by a potential V plays an important role and quantum effects are of importance in the carrier transport of the device.

The invention claimed is:

1. Semiconductor device comprising: a substrate with a multilayer structure, the multilayer structure including a quantum well structure having a semiconductor layer sandwiched by further layers of an electrical insulating material, wherein the device is configured as a field effect transistor with a gate, the gate being positioned substantially parallel to the at least one quantum well structure, and the at least one quantum well and a further quantum well have a distance whereby the at least one quantum well functions as a gate for the further quantum well.

2. Semiconductor device as claimed in claim 1, characterized in that one or more multilayer substructures each comprising a further semiconductor layer and a further electrical insulator layer are stacked on the quantum well structure forming a superlattice.

3. Semiconductor device as claimed in claim 2, characterized in that the insulator is a high-k material having a larger dielectric constant that of $SiO_2$.

4. Semiconductor device as claimed in claim 3, characterized in that the high-k material is crystalline.

5. Semiconductor device as claimed in claim 4, characterized in that there is epitaxy between the high-k material and the semiconductor material of the semiconductor layer.

6. Semiconductor device as claimed in claim 1, characterized in that the insulating layer has an equivalent silicon oxide thickness of less than 1 mm.

7. Semiconductor device-as claimed in claim 1, characterized in that the semiconductor layer comprises silicon.

8. Semiconductor device as claimed in claim 7, characterized in that the thickness of the semiconductor layer is less than 10 nm.

9. Semiconductor device as claimed in claim 7, characterized in that doped regions extending through the quantum well structures form electrical contacts to the quantum well structures.

10. Semiconductor device as claimed in claim 1, characterized in that there is opposite to the gate a further gate present, which further gate is separated from the gate by the quantum well structures.

11. Semiconductor device, comprising:
    a substrate with a multilayer structure, the multilayer structure including a quantum well structure having a semiconductor layer sandwiched by further layers of an electrical insulating material, wherein the semiconductor layer is enclosed by high-k materials with different dielectric constants;
    another quantum well structure separated from said at least one quantum well structure, the at least one quantum well structure functioning as a gate for the other quantum well structure; and
    a gate positioned substantially parallel to said at least one quantum well structure to control the semiconductor device as a field-effect transistor.

* * * * *